United States Patent
Kim

(10) Patent No.: US 8,536,022 B2
(45) Date of Patent: Sep. 17, 2013

(54) METHOD OF GROWING COMPOSITE SUBSTRATE USING A RELAXED STRAINED LAYER

(75) Inventor: Andrew Y. Kim, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 341 days.

(21) Appl. No.: 12/783,354

(22) Filed: May 19, 2010

(65) Prior Publication Data

US 2011/0284993 A1    Nov. 24, 2011

(51) Int. Cl.
*H01L 21/30*    (2006.01)
*H01L 21/46*    (2006.01)

(52) U.S. Cl.
USPC ............ 438/457; 438/455; 438/458; 438/459

(58) Field of Classification Search
None
See application file for complete search history.

(56) References Cited

U.S. PATENT DOCUMENTS

| | | |
|---|---|---|
| 5,374,564 A | 12/1994 | Bruel |
| 6,956,247 B1 | 10/2005 | Stockman |
| 7,012,279 B2 | 3/2006 | Wierer, Jr. et al. |
| 7,279,718 B2 | 10/2007 | Krames et al. |
| 7,294,862 B2 | 11/2007 | Wierer, Jr. et al. |
| 7,442,964 B2 | 10/2008 | Wierer, Jr. et al. |
| 7,442,965 B2 | 10/2008 | Wierer, Jr. et al. |
| 7,642,108 B2 | 1/2010 | Krames et al. |
| 2005/0026394 A1 | 2/2005 | Letertre et al. |
| 2006/0076559 A1* | 4/2006 | Faure et al. ..................... 257/49 |
| 2006/0205178 A1* | 9/2006 | Doyle et al. ................. 438/455 |
| 2007/0069225 A1 | 3/2007 | Krames |
| 2007/0072324 A1 | 3/2007 | Krames et al. |
| 2008/0259980 A1* | 10/2008 | Wierer et al. ............. 372/44.01 |
| 2009/0278233 A1* | 11/2009 | Pinnington et al. .......... 257/615 |
| 2010/0025728 A1 | 2/2010 | Faure |
| 2010/0187496 A1* | 7/2010 | Yan ................................. 257/13 |
| 2011/0062415 A1* | 3/2011 | Ohta et al. ...................... 257/14 |
| 2011/0143522 A1* | 6/2011 | Letertre et al. ............... 438/458 |
| 2011/0177631 A1* | 7/2011 | Gardner et al. ................ 438/26 |

FOREIGN PATENT DOCUMENTS

| WO | 2004061944 A1 | 7/2004 |
|---|---|---|
| WO | 2004077553 A1 | 9/2004 |

OTHER PUBLICATIONS

Hobart et al , "Ultrathin Strained-SOI by Stress Balance on Compliant Substrates and FET Performance" IEEE Transactions on Electron Devices, IEEE Service Center, Piscataway, NJ vol. 52, No. 10, Oct. 1, 2005 p. 2207-2214.

* cited by examiner

*Primary Examiner* — Michael Jung

(57) ABSTRACT

A method according to embodiments of the invention includes providing an epitaxial structure comprising a donor layer and a strained layer. The epitaxial structure is treated to cause the strained layer to relax. Relaxation of the strained layer causes an in-plane lattice constant of the donor layer to change.

20 Claims, 2 Drawing Sheets

METHOD OF GROWING COMPOSITE SUBSTRATE USING A RELAXED STRAINED LAYER

BACKGROUND

1. Field of Invention

The present invention relates to a method of causing an in-plane lattice constant of a donor layer to change.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a composite growth substrate, described in more detail in US 2007/0072324, which is incorporated herein by reference. Substrate 10 includes a host substrate 12, a seed layer 16, and a bonding layer 14 that bonds host 12 to seed 16. Host substrate 12 provides mechanical support to substrate 10 and to the semiconductor device layers 18 grown over substrate 10. Seed layer 16 is the layer on which device layers 18 are grown, thus it must be a material on which III-nitride crystal can nucleate.

As used herein, an "in-plane" lattice constant refers to the actual lattice constant of a semiconductor layer within the device, and a "bulk" lattice constant refers to the lattice constant of relaxed, free-standing material of a given composition. The amount of strain in a layer is defined as $|a_{in-plane} - a_{bulk}|/a_{bulk}$. The bulk lattice constant of a ternary or quaternary III-nitride compound $A_xB_yC_zN$ may be estimated according to Vegards law, where $a_{x,y,z} = x(a_{AN}) + y(a_{BN}) + z(a_{CN})$, where a refers to the bulk lattice constants of the binary compounds. AN has a bulk lattice constant of 3.111 Å, InN has a bulk lattice constant of 3.544 Å, and GaN has a bulk lattice constant of 3.1885 Å.

When the seed layer of the composite substrate of FIG. 1 is a III-nitride material, the seed layer is grown strained on the growth substrate, meaning that $a_{in-plane}$ is not equal to $a_{bulk}$. When the seed layer 16 is connected to host substrate 12 and released from the growth substrate, if the connection between seed layer 16 and host substrate 12 is compliant, for example through a bonding layer 14, seed layer 16 may at least partially relax. For example, when a III-nitride device is conventionally grown on $Al_2O_3$, the first layer grown on the substrate is generally a GaN buffer layer with an a lattice constant of about 3.19. The GaN buffer layer sets the in-plane lattice constant for all of the device layers grown over the buffer layer, including the light emitting layer which is often InGaN. Since InGaN has a larger bulk lattice constant than GaN, the light emitting layer is strained when grown over a GaN buffer layer. In a composite substrate with an InGaN seed layer, after relaxing, the InGaN seed layer may have a larger in-plane lattice constant than GaN. As such, the in-plane lattice constant of the InGaN seed layer is a closer match than GaN to the bulk lattice constant of the InGaN light emitting layer. The device layers grown over the InGaN seed layer, including the InGaN light emitting layer, will replicate the in-plane lattice constant of the InGaN seed layer. Accordingly, an InGaN light emitting layer grown on a relaxed InGaN seed layer may be less strained than an InGaN light emitting layer grown on a GaN buffer layer.

SUMMARY

It is an object of the invention to provide a semiconductor light emitting device that efficiently emits light.

A method according to embodiments of the invention includes providing an epitaxial structure comprising a donor layer and a strained layer. The epitaxial structure is treated to cause the strained layer to relax. Relaxation of the strained layer causes an in-plane lattice constant of the donor layer to change.

A structure according to embodiments comprises a substrate and an epitaxial structure attached to the substrate by a bonding layer. The epitaxial structure comprises a donor layer, wherein the donor layer is a material on which a semiconductor structure may be grown, a strained layer, and a relaxed layer disposed between the donor layer and the strained layer.

In the method and structure described above, the donor layer may be used to form a seed layer for a composite substrate. The donor layer may be grown in an epitaxial structure with the strained layer. When the epitaxial structure is relaxed, the combined strain energy of the donor layer and the strained layer may change the in-plane lattice constant of the donor layer beyond the in-plane lattice constant that may be achieved by relaxing an epitaxial structure that includes only a donor layer. A semiconductor structure including a light emitting layer may be grown on the seed layer. Since the seed layer is at least partially relaxed, the light emitting layer of the semiconductor structure grown on the seed layer may have less strain than a light emitting layer grown over a conventional substrate. As a result, the light emitting layer grown over the seed layer may emit light more efficiently than a conventional light emitting layer, as the light emitting layer grown over the seed layer may have less strain.

DETAILED DESCRIPTION

Figure 1:
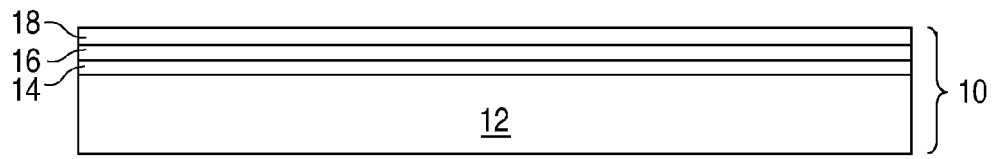
FIG. 1 illustrates a prior art composite growth substrate.

The seed layer 16 illustrated in FIG. 1 is grown on a growth substrate, bonded to the host substrate 12, then released from the growth substrate and forced to relax. As used herein, the seed layer refers to the seed layer after relaxation. The seed layer as grown on the growth substrate, prior to relaxation, is referred to herein as the donor layer.

Strain energy E in the donor layer can be expressed as $E=(0.5)(Y)(d)e^2$, where Y is the modulus of the donor layer, d is the thickness of the donor layer, and e is the strain in the donor layer. The strain energy drives the relaxation of the donor layer when the donor layer is attached to a substrate through a bonding layer, released from the growth substrate, then forced to relax via reflow of the bonding layer. As described above, strain energy is proportional to the thickness of the donor layer and the square of the strain in the donor layer. The composition of the donor layer determines the in-plane lattice constant and therefore the strain in the seed layer. The donor layer is preferably as thick as possible, as increasing thickness increases the strain energy and increases the stiffness of the donor layer against buckling during relaxation. In the case of an InGaN donor layer, seed layers of the desired composition tend to develop undesirable defects and rough surface morphology with increasing thickness. For example, it may be difficult to grow an InGaN donor layer of sufficiently high quality at InN compositions greater than 10% and thicknesses greater than a few hundred nanometers.

In embodiments of the invention, the structure including the donor layer, referred to herein as the donor structure, includes at least one additional layer referred to herein as the mule layer, to increase the thickness and strain energy of the donor structure. The addition of a mule layer may increase the strain energy of the donor structure, which may increase the amount of relaxation in the seed layer. The addition of a mule layer may also increase the thickness of the donor structure, which provides additional stiffness to the donor layer and may reduce or prevent buckling in the seed layer during relaxation.

Figure 2:
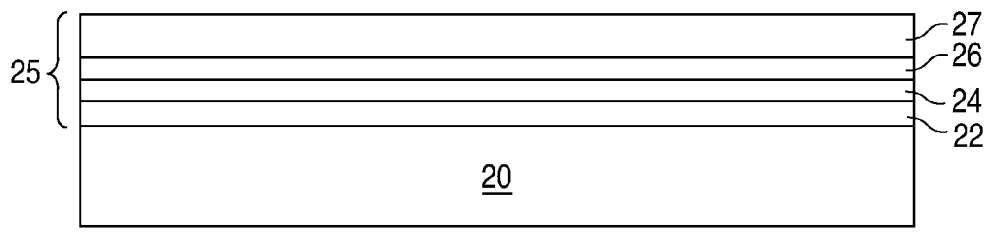
FIG. 2 illustrates a donor structure including a donor layer, a relaxed layer, and a mule layer.

FIG. 2 illustrates one example of a donor structure 25 grown on a growth substrate 20, which may be any suitable growth substrate such as sapphire, SiC, or Si. An optional nucleation layer 22 may be grown first on substrate 20. Nucleation layer 22 may be a material on which III-nitride donor layer 24 will grow, and that readily nucleates on the material of substrate 20. For example, nucleation layer 22 may be GaN when grown on a sapphire substrate 20.

Donor layer 24 is grown over nucleation layer 22. Donor layer 24 is often an InGaN layer, thought it may be, for example, GaN, AlInGaN, another III-nitride material, or another material. Donor layer 24 is a material on which high quality III-nitride device layers may be grown. Donor layer 24 is typically strained. In the case of an InGaN donor layer 24 grown on a GaN nucleation layer 22, the InGaN donor layer 24 is compressively strained. Donor layer 24 is an InGaN layer with InN composition between 1% and 10% in some embodiments, between 1% and 5% in some embodiments, between 5% and 8% in some embodiments, 7% in some embodiments, 6% in some embodiments, and 3% in some embodiments. The thickness of donor layer 24 may be, for example, between 50 nm and 1 micron in some embodiments and between 100 and 500 nm in some embodiments. In some embodiments, the addition of a mule layer permits the use of a donor layer with less strain energy, such as an InGaN donor layer with less InN or even a GaN donor layer, because the mule layer supplements the strain energy of the donor layer. In a donor structure without a mule layer, the composition of InN in the donor layer defines the upper limit for achievable lattice constant since when the in-plane lattice constant reaches the bulk lattice constant, there is no longer any strain energy in the donor structure to drive relaxation. In a donor structure with a mule layer, a low InN composition InGaN donor layer or GaN donor layer that is nominally unstrained upon growth may be driven past the bulk lattice constant into tension by relaxation of the strain energy of the mule layer. The characteristics of the donor structure such as the strain energy and thickness and lattice constant of the donor layer are selected such that the donor layer does not crack if put in tension by relaxing the mule layer. In some embodiments, tensile strain in the seed layer is limited to no more than 0.15%, to prevent cracking.

A relaxed layer 26 is grown on donor layer 24. Relaxed layer 26 has a composition and thickness selected such that it partially or completely relaxes when grown on donor layer 24. The characteristics of relaxed layer 26 are also selected such that a thick, compressively strained mule layer 27 of acceptable quality can be grown over relaxed layer 26. Any defects generated in the relaxed layer propagate only into the mule layer, not the donor layer underneath. In some embodiments, relaxed layer 26 is AlN, which may fully relax within a thickness less than, for example, 100 angstroms. In some embodiments, relaxed layer 26 is AlGaN with a high AlN composition. For example, the AlN composition of an AlGaN relaxed layer 26 may be between 40% and 100% in some embodiments and between 70% and 100% in some embodiments. Relaxed layer 26 may have a thickness between 5 nm and 1 micron in some embodiments, between 20 nm and 500 nm in some embodiments, and between 50 nm and 200 nm in some embodiments.

A mule layer 27 is grown over relaxed layer 26. Mule layer 27 is strained; for example, mule layer 27 may be at least 0.1% strained. The strain in mule layer 27 is often compressive strain. The composition of the mule layer is selected to provide sufficient strain energy to increase the in-plane lattice constant in the donor layer. The mule layer may increase the in-plane lattice constant in the donor layer to less than the bulk lattice constant (partial relaxation), to the bulk lattice constant (relaxation), or past the bulk lattice constant (tension). The composition is selected such that mule layer 27 does not substantially relax or degrade to poor material quality during growth. In addition, the composition is selected such that the mule layer 27 can be grown of sufficiently high quality to a thickness large enough to improve the stiffness of the donor structure to prevent or reduce buckling in the seed layer during relaxation. In some embodiments, mule layer 27 is AlGaN with a composition between 60% AlN and 80% AlN. For example, a 70% AlN AlGaN mule layer 27 grown on an AlN relaxed layer 26 has a compressive strain of about 0.7%, which is comparable to the strain of an InGaN donor layer 24 with an InN composition of 7%, grown on a GaN nucleation layer 22. A high quality mule layer 27 comprised of AlGaN can be grown much thicker than a high quality donor layer 24 comprised of InGaN. Mule layer 27 may be between 100 nm and 20 microns thick in some embodiments and between 1 and 5 microns thick in some embodiments.

Figure 3:
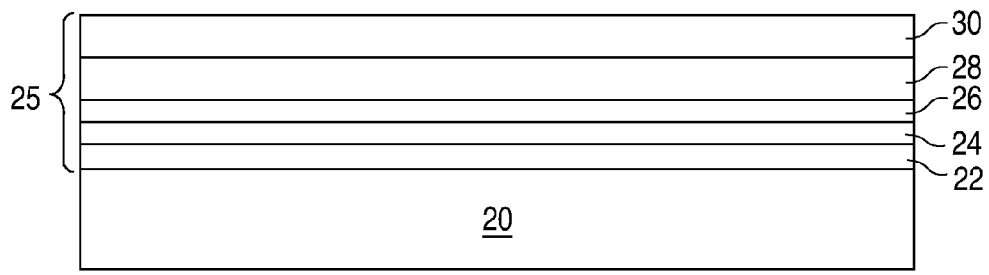
FIG. 3 illustrates a donor structure including a donor layer, two relaxed layers, and a mule layer.

FIG. 3 illustrates another example of a donor structure 25 grown on a growth substrate 20. As in FIG. 2, a nucleation layer 22, donor layer 24, and relaxed layer 26 are grown on growth substrate 20. An additional relaxed layer 28 is grown over relaxed layer 26. The additional relaxed layer 28 grown on relaxed layer 26 provides a step-down in lattice constant from relaxed layer 26 to a more easily grown mule layer 30, which may be, for example, GaN or low AlN composition AlGaN. For example, relaxed layer 26 may be AlN or AlGaN with an AlN composition between 70% and 100%. Interlayer 28 may be, for example, AlGaN with an AlN composition between 20% and 40%. Interlayer 28 may have a thickness between 10 nm and 1 micron in some embodiments, between 20 nm and 500 nm in some embodiments, and between 50 nm and 200 nm in some embodiments. Mule layer 30 may be, for example, GaN grown to a thickness between 100 nm and 20 microns in some embodiments and between 1 and 5 microns in some embodiments. In a donor structure with an InGaN donor layer 24, an AlN relaxed layer 26, a 30% AlN AlGaN interlayer 28, and GaN mule layer 30, GaN mule layer 30 has compressive strain of about 0.7%.

In some embodiments, the compositions and thicknesses of the mule layer and the donor layer are selected such that the compressive strain energy in the donor layer is equal to the compressive strain energy in the mule layer. In some embodiments, the compositions and thicknesses of the mule layer and the donor layer are selected such that the compressive strain energy in the donor layer is more or less than the compressive strain energy in the mule layer. The total strain energy in the donor structure, including the strain energy in the donor layer and the strain energy in the mule layer, is selected to change the lattice constant in the donor layer to desired in-plane lattice constant, when the donor structure is relaxed.

In a first example, a 2500 Å thick strained InGaN donor layer 24 with 6% InN is grown on a relaxed GaN nucleation layer 22. An AlN relaxed layer 26 is grown over the donor layer, followed by a 40000 Å thick AlGaN mule layer 27 with 70% AlN. The donor layer has a compressive strain of about 0.66% as grown and the mule layer has a compressive strain of about 0.74% as grown. After complete relaxation as described below, the mule layer has an in-plane a lattice constant of 3.134 Å and the seed layer has an in-plane a lattice constant of 3.212 Å.

In a second example, a 2500 Å thick InGaN donor layer 24 with 6% InN is grown on a GaN nucleation layer 22. An AlN relaxed layer 26 is grown over the donor layer, followed by a 30% AlN AlGaN relaxed layer 28. The AlN layer 26 has an in-plane a lattice constant of 3.11 Å and the AlGaN layer 28 has an in-plane a lattice constant of 3.165 Å. A 40000 Å thick GaN mule layer 30 grown over relaxed layer 28 replicates the a lattice constant of layer 28, 3.165 Å. The donor layer has a compressive strain of about 0.66% as grown and the mule layer has a compressive strain of about 0.73% as grown. After complete relaxation as described below, the mule layer has an in-plane a lattice constant of 3.189 Å and the seed layer has an in-plane a lattice constant of 3.212 Å.

In a third example, a 2500 Å thick GaN donor layer 24 is grown on a GaN nucleation layer 22. An AlN relaxed layer 26 is grown over the donor layer, followed by a 30% AlN AlGaN relaxed layer 28. A 40000 Å thick GaN mule layer 30 is grown over relaxed layer 28. The donor layer is relaxed as grown (no strain) and the mule layer has a compressive strain of about 0.73% as grown. After complete relaxation as described below, the mule layer has an in-plane a lattice constant of 3.189 Å and the seed layer has an in-plane a lattice constant of 3.212 Å.

In some embodiments, the mule layer is grown before the donor layer. For example, a high InN composition InGaN mule layer may be grown over a growth substrate, followed by a lower InN composition InGaN donor layer. The InGaN donor layer may be better quality material than the InGaN mule layer, due to the high InN composition in the mule layer. The combined strain energy of the mule layer and the donor layer is selected such that during relaxation, the donor layer relaxes to a seed layer with a desired in-plane lattice constant.

Though the examples above use a mule layer in compression to expand the in-plane lattice constant of a donor layer, in other embodiments, a mule layer in tension may be used to apply compression to a donor layer, or reduce the in-plane lattice constant of the donor layer.

The donor structures 25 illustrated in FIGS. 2 and 3 and described above may be formed into a composite substrate as follows.

Figure 4:
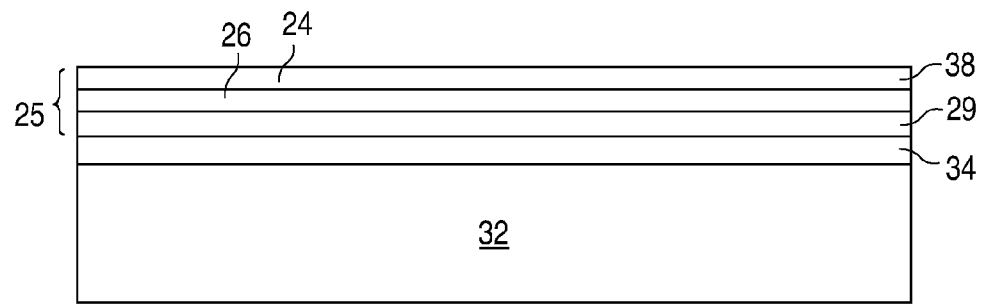
FIG. 4 illustrates part of a donor structure bonded to an intermediate substrate through a bonding layer.

In FIG. 4, donor structure 25 is connected to an intermediate substrate 32 through a bonding layer 34. In some embodiments, bonding layer 34 is $SiO_2$, borophosphosilicate glass (BPSG) or other commercial glasses deposited by, for example, evaporation, sputtering, and sedimentation. Intermediate substrate may be, for example, sapphire, Si, or any other suitable material. Bonding layer 34 may be formed on donor structure 25, intermediate substrate 32, or both. Growth substrate 20 is removed by a technique appropriate to the growth substrate material. For example, a sapphire substrate may be removed by laser melting of any suitable layer such as a lift-off layer as described below grown over the growth substrate before the donor layer. A SiC substrate may be removed by etching. Nucleation layer 22 may be removed by, for example, etching, to expose the surface of donor layer 24. In some embodiments, the donor structure 25 includes a sacrificial semiconductor layer, which is implanted with an implant species such as $H^+$ that facilitates later separation of the donor layer from the growth substrate. The donor layer is separated from the growth substrate by activating the implanted species, for example by heating which causes the implanted area to expand and split the sacrificial layer. Implanting a sacrificial layer and separating a donor layer from a growth substrate by activating the implant species is described in more detail in US Patent Application Publication 2005/0026394 and U.S. Pat. No. 5,374,564, which are incorporated herein by reference. Trenches may be formed in the donor layer 24, or in both the donor layer and the mule layer 29, for example by etching.

The structure illustrated in FIG. 4 may be heated, for example to a temperature greater than 800° C., to cause the donor structure 25 to expand via flow of bonding layer 34. Mule layer 29 may be, for example, mule layer 27 as illustrated in FIG. 2 or mule layer 30 as illustrated in FIG. 3. Thick, compressively-strained mule layer 29 expands, driving the expansion of donor layer 24. Mule layer 29 and donor layer 24 may fully or partially relax. The relaxed donor layer 24 is illustrated as seed layer 38 on FIG. 4. The in-plane lattice constant of seed layer 38 is increased over the in-plane lattice constant of the strained donor layer 24 when still strained and attached to growth substrate 20. After relaxation, the in-plane a lattice constant in the seed layer may be at least 3.192 Å in some embodiments, at least 3.199 Å in some embodiments, at least 3.2 Å in some embodiments, and at least 3.224 Å in some embodiments.

Two bonding steps may be required to form a composite substrate with the III-nitride seed layer 24 in a desired orientation. III-nitride layers grown on sapphire or SiC growth substrates, as illustrated above in FIGS. 2 and 3, are typically grown as c-plane wurtzite. Such wurtzite III-nitride structures have a group III face (also referred to as the gallium face) and a nitrogen face. III-nitrides preferentially grow such that the top surface of the grown layer is the gallium face, while the bottom surface (the surface adjacent to the growth substrate) is the nitrogen face. Simply growing the donor layer conventionally on sapphire or SiC then connecting the donor layer to a host and removing the growth substrate would result in a composite substrate with a III-nitride seed layer with the nitrogen face exposed. III-nitrides preferentially grow on the gallium face, i.e. with the gallium face as the top surface, thus growth on the nitrogen face may undesirably introduce defects into the crystal, or result in poor quality material as the crystal orientation switches from an orientation with the nitrogen face as the top surface to an orientation with the gallium face as the top surface.

To form a composite substrate with a seed layer 24 with the gallium face as the top surface, the donor layer is grown conventionally on a growth substrate as illustrated in FIGS. 2 and 3, then bonded to the intermediate substrate and separated from the growth substrate as illustrated in FIG. 4, such that the seed layer material is bonded to the intermediate substrate through the gallium face, leaving the nitrogen face exposed by removal of the growth substrate.

Figure 5:
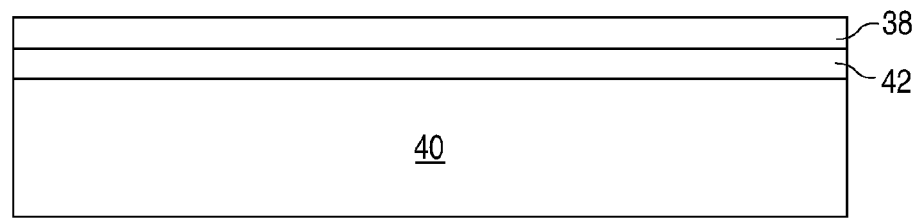
FIG. 5 illustrates a seed layer bonded to a host substrate.

In FIG. 5, the nitrogen face of the seed layer 38 is bonded to a host substrate 40, which may be, for example, sapphire, Si, or any other suitable material. In some embodiments, an optional bonding layer 42 is disposed between seed layer 38 and host substrate 40. Optional bonding layer 42 may be one or more oxides, nitrides, carbides, or fluorides of silicon, aluminum, boron, phosphorus, zinc, gallium, germanium, indium, tin, antimony, lead, bismuth, titanium, tungsten, magnesium, calcium, potassium, nickel, yttrium, zirconium, hafnium, neodymium, and tantalum. After bonding to the host substrate, the intermediate substrate and bonding layer are removed by a technique appropriate to the substrate and bonding layer materials, such as laser melting or etching. A laser for laser melting is selected such that the laser energy is absorbed by the mule layer or relaxed layer, and not by the bonding layer or intermediate substrate. In the final composite substrate, the nitrogen face of the seed layer 38 is bonded to host substrate 40 through optional bonding layer 42, such that the gallium face of III-nitride seed layer 38 is exposed for growth of the device layers.

Mule layer 29 and relaxed layer 26 may be removed, for example by etching or laser melting, leaving seed layer 38 bonded to host substrate 40 through optional bonding layer 42, as illustrated in FIG. 5. In some embodiments, all or part of mule layer 29 is removed by etching to expose an aluminum-containing layer. This layer is oxidized, then relaxed layer 26 and any remaining mule layer 29 are removed by etching. In some embodiments, the relaxed layer 26 and mule layer 29, which are on the top surface of seed layer 38 in the orientation shown in FIG. 5, are exposed to a laser beam at a frequency that is absorbed by the relaxed layer, and not by the mule layer. The interface between the relaxed layer and the mule layer melts, allowing the mule layer to be separated from the relaxed layer. In some embodiments, the relaxed layer 29 is exposed to a laser beam at a frequency that is absorbed by the seed layer, and not by the relaxed layer. The interface between the relaxed layer and the seed layer melts, allowing the relaxed layer to be separated from the seed layer.

Figure 6:
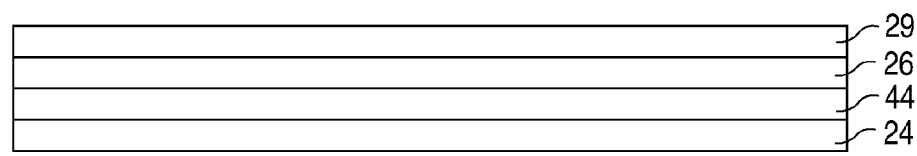
FIG. 6 illustrates a portion of a donor structure including a lift-off layer.

In some embodiments, a low band gap lift-off layer is incorporated in the donor structure to facilitate laser lift off of the mule layer and relaxed layer. FIG. 6 illustrates a portion of a donor structure including a lift-off layer. Lift-off layer 44 is grown after donor layer 24, before relaxed layer 26 and mule layer 29, or after donor layer 24 and relaxed layer 26, and before mule layer 29. Lift-off layer 44 may be, for example, a thin InGaN layer with high InN composition layer. The InN composition in lift-off layer 44 is selected such that the lift-off layer absorbs light at a frequency emitted by the laser used for laser lift off. The laser frequency is selected such that the layers in the donor structure that the laser sees before the lift-off layer do not absorb the laser light. In some embodiments, the band gap of lift-off layer 44 is selected to be much lower than the band gap of the layer in the donor structure with the next lowest band gap, often the donor layer 24. The lift-off layer may be InGaN with an InN composition between 2% and 25% in some embodiments. The lift-off layer may be between 10 and 500 nm thick.

The donor layer 24 illustrated in FIG. 6 may be connected as a relaxed seed layer to a host substrate through a bonding layer, as described above in FIGS. 4 and 5 and accompanying text. The mule layer 29 and relaxed layer 26 may be removed by shining a laser beam through the top surface of the mule layer to melt lift-off layer 44 and release relaxed layer 26 and mule layer 29 from donor layer 24.

Figure 8:
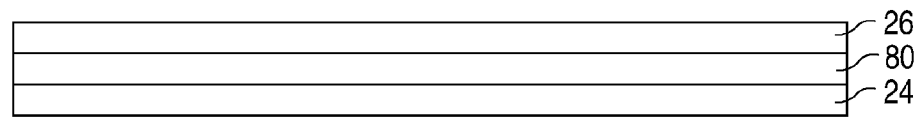
FIG. 8 illustrates a portion of a donor structure including a cap layer.

In some embodiments, a cap layer is formed over donor layer 24, for example to prevent indium desorption from an InGaN donor layer 24. The cap layer may be, for example, GaN. In the donor structure illustrated in FIGS. 2 and 3, the cap layer 80 may be disposed between donor layer 24 and relaxed layer 26, as illustrated in FIG. 8. In the partial donor structure illustrated in FIG. 6, the cap layer may be disposed between lift-off layer 44 and relaxed layer 26.

A III-nitride device may be grown on the seed layer 38 of the composite substrate illustrated in FIG. 5. Though in the examples below the semiconductor device is a III-nitride LED that emits visible or UV light, embodiments of the invention may be used to grow other semiconductor optoelectronic or electronic devices besides LEDs, such as laser diodes, field effect transistors, and detectors, and devices from materials systems other than III-nitride, such as III-phosphide, other III-V, II-VI, or other devices.

Device layers are grown over seed layer 38. The device layers may have the same in-plane lattice constant as seed layer 38. The device layers include a light emitting or active region sandwiched between n- and p-type regions. The n-type region is typically grown first and may include multiple layers of different compositions and dopant concentration including, for example, preparation layers such as buffer layers or nucleation layers, which may be n-type or not intentionally doped, layers to facilitate later removal of the host substrate 40, bonding layer 42, seed layer 38, or the entire composite substrate, and n- or even p-type device layers designed for particular optical or electrical properties desirable for the light emitting region to efficiently emit light. The light emitting or active region is grown over the n-type region. Examples of suitable light emitting regions include a single thick or thin light emitting layer, or a multiple quantum well light emitting region including multiple thin or thick quantum well light emitting layers separated by barrier layers. The p-type region is grown over the light emitting region. Like the n-type region, the p-type region may include multiple layers of different composition, thickness, and dopant concentration, including layers that are not intentionally doped, or n-type layers.

Figure 7:
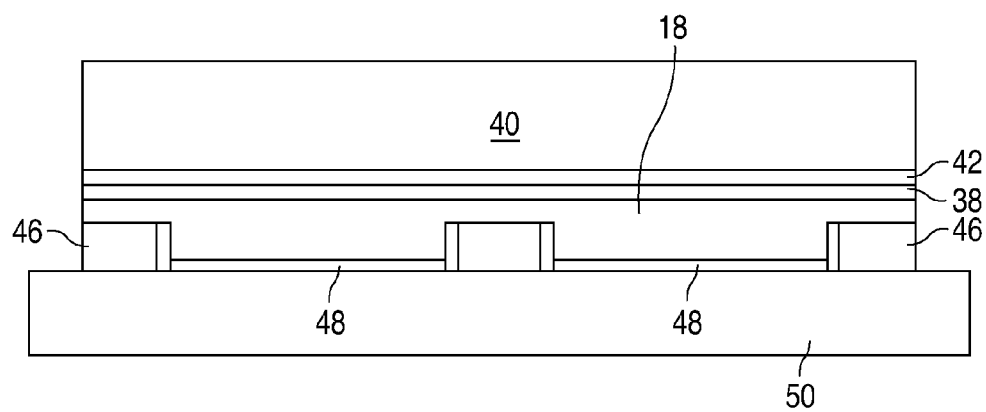
FIG. 7 illustrates a flip chip semiconductor device grown on the composite substrate illustrated in FIG. 5.

FIG. 7 illustrates a flip chip device. The device layers 18 are grown on the seed layer 38 of a composite substrate including seed layer 38, bonding layer 42, and host substrate 40. P-contact metal is formed, then portions of the p-contacts 48, the p-type region, and the active region are removed to expose portions of the n-type region on which n-contact metals 46 are disposed. In the device illustrated in FIG. 7, multiple n-contact regions are interposed by p-contact regions. In other embodiments, a single n-contact region and a single p-contact region are formed. The p-contacts 48 and n-contacts 46 are formed on the same side of the device. The contacts are generally reflective and the device is generally mounted on a mount 50 flipped relative to the growth direction, such that light is extracted through the top surface of the device in the orientation shown in FIG. 7.

The device is mounted to a mount 50 through interconnects (not shown) between n- and p-contacts 46 and 48 and mount 50. For example, the interconnects may be gold-gold interconnects and the device may be attached to the mount by thermosonic bonding, or the interconnects may be solder and the device may be attached to the mount by reflow soldering. The composite substrate may remain part of the device as illustrated in FIG. 7, or the entire composite substrate, the host substrate 40, or the bonding layer 42 may be removed by a technique appropriate to the materials removed, such as laser lift-off, etching, or a mechanical process such as grinding or chemical mechanical polishing. The epitaxial structure may be thinned, for example by photoelectrochemical etching. The top surface of the epitaxial structure remaining after thinning may be textured to improve light extraction, for example by roughening or by patterning the surface with, for example, a lattice or photonic crystal structure. A structure known in the art such as a wavelength converting element, a dichroic filter, or a lens may be formed over the epitaxial structure.

Other device structures besides a flip chip may be used. In one alternative, light may be extracted from the device through the top surface of the epitaxial structure, i.e. the surface on which the n- and p-contacts 46 and 48 are formed. In some embodiments, the top portion of the p-type region may be grown under conditions that form a rough surface, a separate, rough p-type layer may be grown over the p-type region, or a smooth surface of a p-type layer may be etched or roughened after growth. A layer of a transparent, conductive material such as a transparent, conductive oxide may be formed over the p-type surface. For example, the transparent conductive material may be indium tin oxide, zinc oxide, or ruthenium oxide. A portion of the p-type structure and the light emitting region are removed to expose an n-type layer. N-contact 46 is formed on the exposed n-type layer. P-contact 48 is formed on a portion of the transparent, conductive material, which spreads current laterally through the p-type region 38. N- and p-contacts 46 and 48 may be limited in extent or made transparent. The device may be mounted such that light is extracted through the surface of the transparent material.

In another alternative, a vertical injection LED is formed. A p-contact is formed on the surface of the p-type region and the epitaxial structure is attached to a mount through the p-contact. All or a portion of the composite substrate may be removed to expose the surface of an n-type region. For example, the host substrate may be removed to expose a conductive bonding or seed layer on which an n-contact may be formed, or all or a portion of the host, bonding layer, and seed layer may be removed to expose the n-type region of the device layers. An n-contact is formed on the exposed surface, or on another exposed n-type surface, such as a side surface of an n-type region. The n-contact is formed on one side of the semiconductor structure (for example, the top surface), and a p-contact is formed on the other side of the semiconductor structure (for example, the bottom surface). Electrical contact to the n-contact may be made with any suitable structure such as a wire bond or a conductive bridge. The extent of the n-contact may be limited such that light may be extracted from the top of the device.

In some embodiments, a structure is included in the device to increase light extraction from the device, for example by increasing scattering. For example, a surface of the epitaxial structure may be roughened. In some embodiments, scattering is caused by a photonic crystal or lattice embedded in or formed on the surface of the III-nitride structure. In such a structure, changes in the optical index of refraction are provided in a periodic manner, at a spacing that is near the wavelength of light emitted by the light emitting region in the material. The parameters of the periodic index change, such as the period and amplitude, may be selected to increase the amount of light extracted into a desired emission pattern. For example, the size and spacing of a lattice or photonic crystal may be selected to maximize the amount of light extracted in a direction normal to a top surface of the semiconductor structure. Selecting the parameters for and forming a photonic crystal are described in more detail in U.S. Pat. Nos. 7,642,108, 7,442,965, 7,442,964, 7,294,862, 7,279,718, 7,012,279, and 6,956,247, all of which are incorporated herein by reference.

One or more wavelength converting materials may be disposed over the device to create white light or monochromatic light of other colors. Unconverted light emitted by the LED may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device. Multiple wavelength converting materials may be mixed in a single wavelength converting layer or formed as discrete layers. Examples of suitable wavelength converting structures include pre-formed ceramic phosphor layers that are glued or bonded to the LED, or a powder phosphor disposed in an organic encapsulant that is electrophoretically deposited, stenciled, screen printed, sprayed, sedimented, evaporated, sputtered, or otherwise dispensed over the LED.

Though the embodiments described above use a mule layer in a III-V structure such as a III-nitride structure, embodiments of the invention may be implemented in other materials systems such as Si. For example, a mule layer may allow the fabrication of strained silicon that is potentially cheaper and has fewer defects than strained silicon fabricated by conventional methods. A conventional method employs growth of a relaxed SiGe heterostructure on Si, then the growth of a thin Si "donor" layer on the relaxed SiGe which grows with tensile strain. The thin Si donor layer is transferred to a host and the Si substrate and SiGe layer are removed by activating an implanted sacrificial layer as described above. Dislocations generated in the relaxed SiGe undesirably propagate into the Si strained "donor" layer. In a device including a mule layer, a thick compressively strained SiGe mule layer is grown on Si (no relaxed layer in between) and transferred to a carrier substrate. Most of the Si is removed, leaving only a thin Si "donor" layer. The structure is annealed to relax the SiGe and pull the Si "donor" layer into tensile strain. As an alternative to a SiGe mule layer, a relaxed SiGe layer may be grown, followed by a tensile strained SiGe mule layer with Ge composition greater than the relaxed SiGe layer. A strained SiGe mule layer nominally generates no defects; with a relaxed SiGe layer and pure Ge mule layer, all of the defects are generated in the relaxed layer and propagate only into the mule layer, not the donor layer underneath.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   providing an epitaxial structure comprising:
   a donor layer; and
   a strained layer;

treating the epitaxial structure to cause the strained layer to relax, wherein relaxation of the strained layer causes an in-plane lattice constant of the donor layer to change such that the donor layer becomes a seed layer;

removing the strained layer from the seed layer; and growing a semiconductor structure on the seed layer after removing the strained layer.

2. The method of claim 1 wherein the epitaxial structure further comprises a relaxed layer disposed between the donor layer and the strained layer.

3. The method of claim 2 wherein the epitaxial structure further comprises a second relaxed layer disposed between the donor layer and the strained layer.

4. The method of claim 2 wherein the relaxed layer comprises aluminum.

5. The method of claim 1 wherein the providing of the epitaxial structure comprises growing the epitaxial structure on a first substrate, the method further comprising:

connecting the epitaxial structure to a second substrate; and removing the first substrate after the connecting.

6. The method of claim 5 wherein:

the epitaxial structure is connected to the second substrate through a bonding layer; and the treating of the epitaxial structure comprises heating the bonding layer.

7. The method of claim 5 further comprising:

connecting the seed layer to a third substrate; and removing the strained layer after connecting the seed layer to the third substrate.

8. The method of claim 1 wherein strain in the strained layer is at least as great as strain in the donor layer.

9. The method of claim 1 wherein:

the donor layer is InGaN or GaN;

the strained layer is AlGaN or GaN; and the epitaxial structure further comprises a relaxed layer disposed between the donor layer and the strained layer, wherein the relaxed layer comprises aluminum.

10. The method of claim 1, wherein after treating, the seed layer has an in-plane lattice constant of at least 3.2 A.

11. The method of claim 1, wherein the semiconductor structure includes a light emitting layer disposed between an n-type region and a p-type region on the seed layer.

12. The method of claim 1 wherein:

prior to the treating of the epitaxial structure, the donor layer is in compression; and the treating comprises causing the in-plane lattice constant of the donor layer to increase such that after treating, the seed layer is at least partially relaxed.

13. The method of claim 1 wherein:

prior to the treating of the epitaxial structure, the donor layer is relaxed; and the treating comprises causing the in-plane lattice constant of the donor layer to increase such that after treating, the seed layer is in tension.

14. The method of claim 1 wherein prior to the treating of the epitaxial structure, the strained layer is in compression.

15. The method of claim 1 wherein prior to the treating of the epitaxial structure, strain in the strained layer is at least 0.1%.

16. The method of claim 1, wherein the strained layer has a thickness between 100 nm and 20 microns.

17. The method of claim 1, wherein the strained layer has a thickness between 1 and 5 microns.

18. The method of claim 1, wherein the strained layer has a compressive strain of at least 0.1%.

19. A method comprising:

providing an epitaxial structure comprising:

a donor layer, wherein the donor layer is a material on which a semiconductor structure may be grown; and a strained layer; and treating the epitaxial structure to cause the strained layer to relax, wherein relaxation of the strained layer causes an in-plane lattice constant of the donor layer to change;

wherein the epitaxial structure further comprises a relaxed layer disposed between the donor layer and the strained layer, and a cap layer disposed between the donor layer and the strained layer, wherein the cap layer is configured to reduce or prevent desorption from the donor layer.

20. A method comprising:

providing an epitaxial structure comprising:

a donor layer, wherein the donor layer is a material on which a semiconductor structure may be grown; and a strained layer;

treating the epitaxial structure to cause the strained layer to relax, wherein relaxation of the strained layer causes an in-plane lattice constant of the donor layer to change such that the donor layer becomes a seed layer;

connecting the seed layer to a third substrate; and removing the strained layer from the seed layer;

wherein:

the epitaxial structure further comprises a low band gap layer disposed between the seed layer and the strained layer, the low band gap layer has a band gap lower than band gaps of the seed layer and the strained layer; and the removing of the strained layer comprises melting the low band gap layer with a laser.

* * * * *